METHOD OF TESTING PRINTED CIRCUIT CONDUCTORS

Original Filed March 24, 1964

INVENTORS
ROBERT P. BURR
ROBERT L. SWIGGETT
BY Charles A. Blank
ATTORNEY 3,396,335

METHOD OF TESTING PRINTED CIRCUIT CONDUCTORS

Robert P. Burr, Lloyd Harbor, and Robert L. Swiggett, Lloyd Harbor, Huntington, N.Y., assignors to Circuit Research Company, Glen Cove, N.Y., a New York partnership Continuation of application Ser. No. 354,269, Mar. 24, 1964. This application Aug. 26, 1966, Ser. No. 575,473
5 Claims. (Cl. 324—51)

Figure 1:
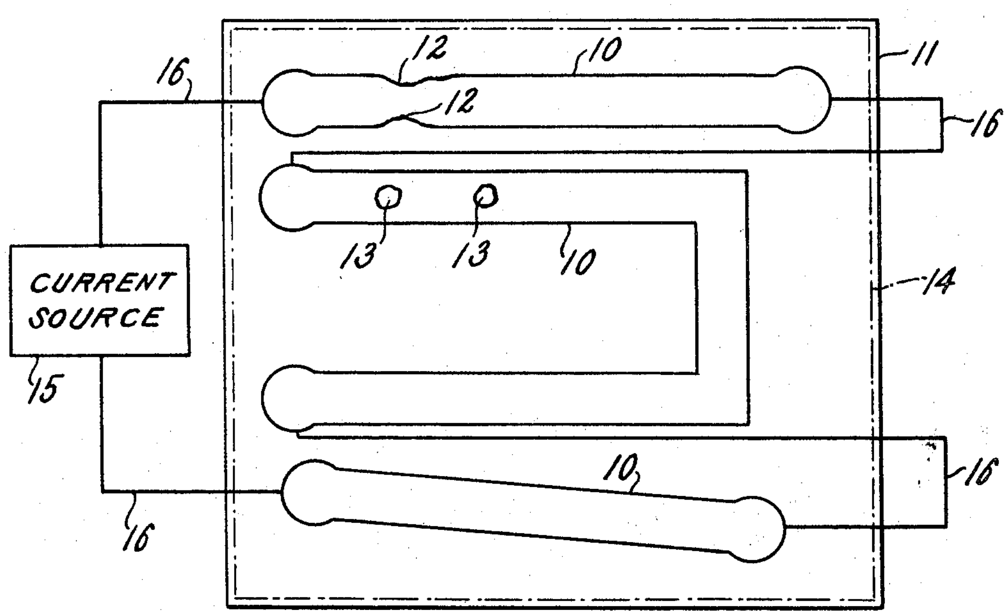

This application is a continuation of applictaion Ser. No. 354,269, filed Mar. 24, 1964, and now abandoned.

This invention relates to methods of testing printed circuit conductors and, more particularly, to methods of testing such conductors to detect defects therein. As used herein, the term printed circuit conductors is intended to include conductors which may be formed by, for example, suitable photo-printing, plating or etching techniques or by mechanical or other techniques for making conductors having the general appearance of conductors made by printing, plating or etching techniques. The manufacturing process may be, for example, a copper-additive or a copper-subtractive process.

A common problem in the manufacture of printed circuit conductors on insulating boards is the limitation of accuracy in visual inspection of the finished product to ascertain that the component is operational for the purpose for which it was designed. This problem arises in the manufacture of the conductor pattern by a process of chemical etching or metallic deposition in which the configuration of the conductors ultimately produced is dependent during the manufacturing process upon the integrity or reliability of a resist of a masking material. For example, in the manufacture of etched components, an etch resist is applied to the insulating board generally in the form of an ink, which protects a copper sheet thereunder from the action of an etching solution. In the manufacture of electroplated components, the resist is in the form of a mask which obscures all portions of the board except the areas in which conductors are actually to be deposited. In still another process, the conductors may be formed by an electroless deposit of copper upon an ink pattern printed on a board and having the configuration of the desired conductor pattern.

In the manufacturing processes described above and in variations of those processes, it frequently occurs that portions of the resist, the mask, or the ink pattern become inoperative at some stage of manufacture. This causes the finished conductor pattern to have irregularities at the edges of the conductors, or occasionally a pitted area occurs in the middle of a conductor. Defects of this type usually result in a visual determination that the board is unsatisfactory, although with the vast majority of such defects, the presence of the small irregularities in no way degrades the operational utility of a component.

It is an object of the present invention, therefore, to provide a new and improved method of testing printed circuit conductors to detect operational defects therein while distinguishing irregularities causing no operational defect.

It is another object of the invention to provide a new and improved method of testing printed circuit conductors to detect operational defects therein independently of the geometry of the conductors.

It is another object of the invention to provide a new and improved method of testing printed circuit conductors to detect operational defects therein, which test may be readily utilized and interpreted by unskilled personnel.

In accordance with the invention, a method of testing printed circuit conductors to detect operational defects therein comprises maintaining a heat-sensitive sheet, which changes color in local areas in response to local temperature rises, in intimate contact with a printed circuit conductor. The method also includes the step of supplying through the conductor current flow of a magnitude insufficient to cause a temperature rise effecting a color change in the sheet in flawless areas of the conductor but of a magnitude sufficient to cause a temperature rise effecting a local color change in the sheet in areas of higher impedance of the conductor, thereby indicating local operational defects of the conductor.

For a better understanding of the present invention, together with other and further objects thereof, reference is made to the following description, taken in connection with the accompanying drawing, and its scope will be pointed out in the appended claims.

Figure 2:
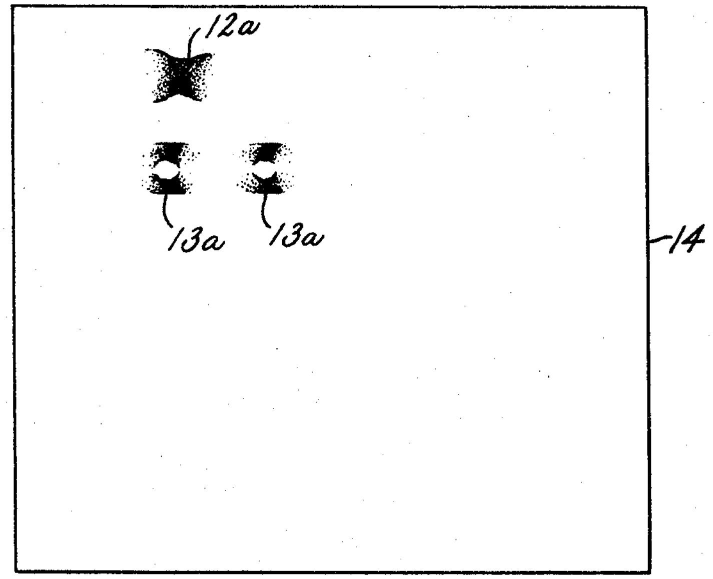

Referring now to the drawing:

FIG. 1 is a plan view of a printed circuit conductor pattern, with operational defects to an exaggerated scale therein, connected to a suitable current source for testing the pattern in accordance with the invention upon the application thereto of a heat-sensitive sheet represented in broken-line construction in FIG. 1; and FIG. 2 is a plan view of the surface of the heat-sensitive sheet after contact with the conductor pattern, reprerepresenting a color change indicating operational defects of the conductor pattern.

Referring now more particularly to FIG. 1, a pattern of printed circuit conductors 10 has been manufactured on a suitable insulating board 11 and may have visually detectable irregularities or small pits therein as indicated by edges 12 and pits or voids 13. Other irregularities may not be visually detectable.

In accordance with our invention, we recognize that operationally defective conductors have local areas of higher impedance which cause increased local temperature rises during current flow therethrough, and that such local temperature rises can be detected by maintaining a heat-sensitive sheet 14, which changes color in local areas in response to a local temperature rise, in intimate contact with the printed circuit conductors. A suitable source of current 15 and external connections 16 may be connected to the conductors to supply through the conductors current flow of a magnitude insufficient to cause a temperature rise effecting a color change in the sheet in operationally flawless areas of the conductors but of a magnitude sufficient to cause a temperature rise effecting a local color change in the sheet in areas of higher impedance of the conductor, thereby indicating local operational defects of the conductor.

The heat-sensitive sheet may, for example, be a commercially available Thermo-Fax paper such as used with duplicating machines, having the property that above a temperature of 100° F. (at, for example, approximately 180° F.), the paper turns black. Thermo-Fax is a registered trademark of Minnesota Mining and Manufacturing Co. Such papers may have two meltable layers containing mutually interreactable salts, providing a visible copy when the two layers are caused to melt and intermix. A fatty acid salt of a heavy metal may be used with an organic acid, or a sulphide. Another type of Thermo-Fax paper has a heat-sensitive coating consisting of a wax which melts to form a translucent area through which the image appears from a colored opaque backing.

In practicing our invention, the conductor pattern to be tested may be connected in a circuit such that a preselected value of current, for example, five amperes, representing the current-carrying capacity of flawless conductors for an ecceptable temperature rise, is passed through all conductors of the pattern. This value of current may may be preselected within the current-carrying capacity of flawless conductors as the maximum current value which should not cause a temperature rise in flawless conductors to the temperature resulting in color change of the heat-sensitive paper to be utilized. A sheet of heat-sensitive paper preferably of approximately the same dimensions as the board supporting the conductor pattern may then be brought into contact with the conductor pattern and held for a period of time, for example, two seconds so that the paper is in intimate contact with all portions of the conductor pattern. A suitable foam rubber backing pad (not shown) may be used to support the paper for this purpose.

When the paper is removed from contact with the pattern, the surface of the paper previously in contact with the pattern, may be examined for discolorations. As indicated in FIG. 2, regions of high impedance of the conductor cause local temperature rises, causing discolorations 12*a*, 13*a* of the paper. The presence of such discolorations indicates that the component is operationally defective. If no discoloration appears, the component is operationally acceptable regardless of minor irregularities in the geometry of the particular conductors.

With some types of heat-sensitive papers, the presence of discoloration may be detected by looking through the back of the paper without removing the paper from the pattern.

A high resolution of error detection is obtainable in accordance with the invention because the resolution is limited only by the granularity of the heat-sensitive elements in the paper and this granularity can be made small in comparison to any defect likely to occur in a printed conductor pattern.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. The method of testing printed circuit conductors to indicate limitations on the current-carrying capacity thereof comprising:

maintaining a self-supporting, heat-sensitive sheet, which changes color in local areas in response to local temperature rises, in intimate contact with a printed circuit conductor;

and supplying through said conductor current flow of a magniture less than that which causes a temperature rise effecting a color change in said sheet in areas of said conductor having the desired current-carrying capacity but of a magnitude sufficient to cause a temperature rise effecting a local color change in said sheet in areas of higher impedance of said conductor, thereby indicating a limitation on the current-carrying capacity of the conductor.

2. The method of testing printed circuit conductors to detect operational defects therein comprising:

maintaining a self-supporting heat sensitive paper, which changes color in local areas in response to local temperature rises, in intimate contact with a printed circuit conductor;

and supplying through said conductor current flow of a magnitude less than that which causes a temperature rise effecting a color change in said paper in operational flawless areas of said conductor but of a magnitude sufficient to cause a temperature rise effecting a local color change in said paper in areas of higher impedance of said conductor, thereby indicating local operational defects of said conductor.

3. The method of testing printed circuit conductors to detect operational defects therein without contaminating the conductors comprising:

maintaining a self-supporting, non-contaminating, heat sensitive paper, which changes color in local areas in response to local temperature rises, in intimate contact with a printed circuit conductor;

and supplying through said conductor current flow of a magnitude less than that which causes a temperature rise effecting a color change in said paper in operational flawless areas of said conductor but of a magnitude sufficient to cause a temperature rise effecting a local color change in said paper in areas of higher impedance of said conductor, thereby indicating local operational defects of said conductor without contamination thereof.

4. The method set forth in claim 3 wherein said paper contains heat sensitive elements having a granularity less than the size of the defects in printed circuit conductors.

5. The method of testing printed circuit conductors to detect operational defects therein comprising:

maintaining a self-supporting, heat-sensitive paper, which changes color in local areas in response to local temperature rises above approximately 180° Fahrenheit, in intimate contact with a printed circuit conductor;

supplying through said conductor current flow of a magnitude less than that which causes a temperature rise in said paper of above approximately 180° Fahrenheit in operationally flawless areas of said conductor but of a magnitude sufficient to cause a temperature rise in said paper of above approximately 180° Fahrenheit for effecting a local color change in said sheet in areas of higher impedance of said conductor, thereby indicating local operational defects of said conductor; and lifting said paper from said conductor and examining said paper to ascertain operational defects in said conductor.

References Cited

UNITED STATES PATENTS

| | | | |
|---|---|---|---|
| 2,673,325 | 3/1954 | Orr | 324—32 |
| 2,637,657 | 5/1953 | Ozols | 73—356 X |

RICHARD C. QUEISSER, *Primary Examiner.*

J. P. BEAUCHAMP, *Assistant Examiner.*